United States Patent [19]
Teruya et al.

[11] Patent Number: 5,583,427
[45] Date of Patent: Dec. 10, 1996

[54] TOMOGRAPHIC DETERMINATION OF THE POWER DISTRIBUTION IN ELECTRON BEAMS

[75] Inventors: Alan T. Teruya, Livermore; John W. Elmer, Pleasanton, both of Calif.

[73] Assignee: Regents of the University of California, Oakland, Calif.

[21] Appl. No.: 545,070

[22] Filed: Oct. 19, 1995

Related U.S. Application Data

[60] Continuation-in-part of Ser. No. 283,438, Aug. 1, 1994, Pat. No. 5,468,966, which is a division of Ser. No. 966,892, Dec. 28, 1992, Pat. No. 5,382,895.

[51] Int. Cl.⁶ ........................................... G01N 27/00
[52] U.S. Cl. ........................... 324/71.3; 250/397
[58] Field of Search ........................... 324/71.3, 404; 250/397, 396 ML, 305

[56] References Cited

U.S. PATENT DOCUMENTS

| | | | |
|---|---|---|---|
| 4,455,532 | 6/1984 | Gregory et al. | 324/71.3 |
| 4,480,220 | 10/1984 | Isakozawa | 324/71.3 |
| 4,608,493 | 8/1986 | Hayafuji | 250/397 |
| 4,629,975 | 12/1986 | Fiorito et al. | 324/71.3 |
| 5,103,161 | 4/1992 | Bogaty | 324/71.3 |
| 5,193,105 | 3/1993 | Rand et al. | 250/396 ML |
| 5,285,074 | 2/1994 | Haire et al. | 250/396 ML |
| 5,289,519 | 2/1994 | Rand | 250/396 ML |
| 5,319,212 | 6/1994 | Tokoro | 250/397 |
| 5,382,845 | 1/1995 | Elmer et al. | 324/71.3 |

*Primary Examiner*—Maura K. Regan
*Attorney, Agent, or Firm*—Henry P. Sartorio; L. E. Carnahan

[57] ABSTRACT

A tomographic technique for determining the power distribution of an electron beam using electron beam profile data acquired from a modified Faraday cup to create an image of the current density in high and low power beams. A refractory metal disk with a number of radially extending slits is placed above a Faraday cup. The beam is swept in a circular pattern so that its path crosses each slit in a perpendicular manner, thus acquiring all the data needed for a reconstruction in one circular sweep. Also, a single computer is used to generate the signals actuating the sweep, to acquire that data, and to do the reconstruction, thus reducing the time and equipment necessary to complete the process.

20 Claims, 3 Drawing Sheets

TOMOGRAPHIC DETERMINATION OF THE POWER DISTRIBUTION IN ELECTRON BEAMS

The United States Government has rights in this invention pursuant to Contract No. W-7405-ENG-48 between the United States Department of Energy and the University of California for the operation of Lawrence Livermore National Laboratory.

RELATED APPLICATIONS

This application is a continuation-in-part of U.S. application Ser. No. 08/283,438 filed Aug. 1, 1994, now U.S. Pat. No. 5,468,966 which is a divisional application of U.S. application Ser. No. 07/996,892 filed Dec. 28, 1992, now U.S. Pat. No. 5,382,895, issued Jan. 17, 1995.

BACKGROUND OF THE INVENTION

The present invention relates to the measurement of the current density distribution in electron and ion beams, particularly to a technique using a modified Faraday cup having a narrow slit to create an image of the current density of such beams, and more particularly to a simplified technique using a modified Faraday cup having a disk with radial slits and a single computer to acquire the data and create an image of the current density of such beams.

A system and process for tomographic determination of the power distribution in electron beams, as described and claimed in above-referenced copending application Ser. No. 08/283,438 and U.S. Pat. No. 5,382,895, allowed a user to measure the power distribution and thus be able to tailor it to the user's specific needs. That system utilized a modified Faraday cup to acquire profiles of the electron beam at a number of different angles. The modified Faraday cup includes a slit that is much narrower than the width of the beam in front of the Faraday cup that collects the portion of the beam that passes through the slit when the beam is swept across the slit using deflection coils. This portion of the beam forms a current that travels to ground through a signal wire and a sensing resistor. The current creates a voltage across the resistor that is read by an analog to digital acquisition device. The data acquisition device thus saves a time record which contains a profile of the beam as it travels across the slit. Beam profiles are taken at a number of different angles by rotating the slit and sweeping the beam across it. The system uses these profiles to do a reconstruction of the beam power density distribution using mathematical techniques originally developed for the non-destructive evaluation of solid objects using x-rays.

A disadvantage of the above-referenced system and process is that acquiring data requires a repetitive sequence of rotating the slit into position, turning on the beam and sweeping it, recording the beam profile, and stopping the beam before moving the slit to the next angular position. A full set of beam profile data can take as much as ten minutes to acquire and the results may be adversely affected by an unstable beam, due to the beam being repetitively turned on and off.

The present invention overcomes the above-described disadvantage of the system and process of the above-referenced copending application and patent, by eliminating this repetitive beam profile data acquisition process by utilizing a disk with a number of radial slits, eliminating the need for a stepper motor for rotating the slit and its associated wiring, and allows the necessary data to be taken in a fraction of a second, thus improving the quality of the data. In addition, a single computer is used to generate the signals actuating the sweep of the beam around the radially slit disk, to acquire the data, and to do the reconstruction. Thus, the present invention significantly reduces the apparatus and the time for determining the power distribution in electron beams.

SUMMARY OF THE INVENTION

It is an object of the present invention to provide tomographic determination of the power distribution in electron or ion beams.

A further object of the invention is to provide an improved system and process for determining the profile data of an electron or ion beam.

A further object of the invention is to provide for measuring electron beam current density using a modified Faraday cup, a disk with radial slits, and a single computer tomographic technique.

Another object of the invention is to provide an improved computer tomographic technique to create an image of the current density in low and high power beams using beam profile data acquired from a modified Faraday cup.

Another object of the invention is to provide for acquiring electron beam profile data by sweeping the beam across a number of radially extending narrow slits in a Faraday cup, with the beam current waveforms being recorded at spaced angles as the beam sweeps around the radially extending slits.

Another object of the invention is to provide an improved system and process for determining the power distribution in electron or ion beams, which utilizes a modified Faraday cup having a disk with a number of equally spaced, narrow, radially extending slit, and a single computer for generating signal actuating a sweep of the disk by a beam, to acquire the data, and to do a reconstruction of the beam from the acquired data.

Other objects and advantages will become apparent from the following description and the accompanying drawings. The present invention is an improvement over the system and process described and claimed in above-referenced copending application Ser. No. 08/283,438 and U.S. Pat. No. 5,382,895. This invention simplifies the data acquisition and provides the operator with the final reconstructed image much more quickly and easily. This is accomplished by eliminating the stepper motor of the prior approach to acquire data at different angles by rotating the assembly containing the slit and the Faraday cup. Instead, a refractory metal disk with a number of slits cut in radial directions is placed above a Faraday cup. The beam is swept in a circular pattern so that its path crosses each slit in a perpendicular manner, thus acquiring all the data needed for a reconstruction in one circular sweep. This reduces the time to acquire a full set of data from about ten minutes to a fraction of a second. Also, a single computer is used to generate the signals actuating the sweep of the disk, to acquire the data, and to do the reconstruction, thus reducing the amount of apparatus necessary and the amount of time necessary to complete the tomographic process. Thus, the present invention enables a quick examination of a beam power density prior to use to ensure that the beam has desired characteristics as well as a diagnostic tool for determining changes in an electron beam gun over time.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention involves a system and process for tomographic determination of the power distribution in electron beams to allow a user to measure the power distribution and thus be able to tailor it to the user's specific needs. This invention is an improvement of the system and process of above-referenced copending application Ser. No. 08/283,438 and U.S. Pat. No. 5,382,895. The simplified process and system of this invention reduces system components and the time required to obtain a full set of data and reconstruct to beam profile. Basically the improved system and process replaces the single slit of the modified Faraday cup with a slit disk which eliminates the repetitive sequence of rotating the slit into various positions by a stepping motor, turning on the beam and sweeping the slit at each of the positions, and recording the beam profile for reconstruction of the beam. Using the slit disk of this invention, the beam is swept in a circular pattern so that it crosses each slit in the disk in a perpendicular manner, thus acquiring all the data needed for reconstruction in one circular sweep. In addition, the present invention reduces the system components by using a single computer to generate the signals actuating the sweep, to acquire the data, and to do the reconstruction of the beam profile. The time involved for collection of a full set of data is reduced from about ten minutes to a fraction of a second, and additionally eliminates any results adversely affected by an unstable beam due to it being turned on and off at the various slit positions, as the single slit is rotated from position to position.

Figure 3:
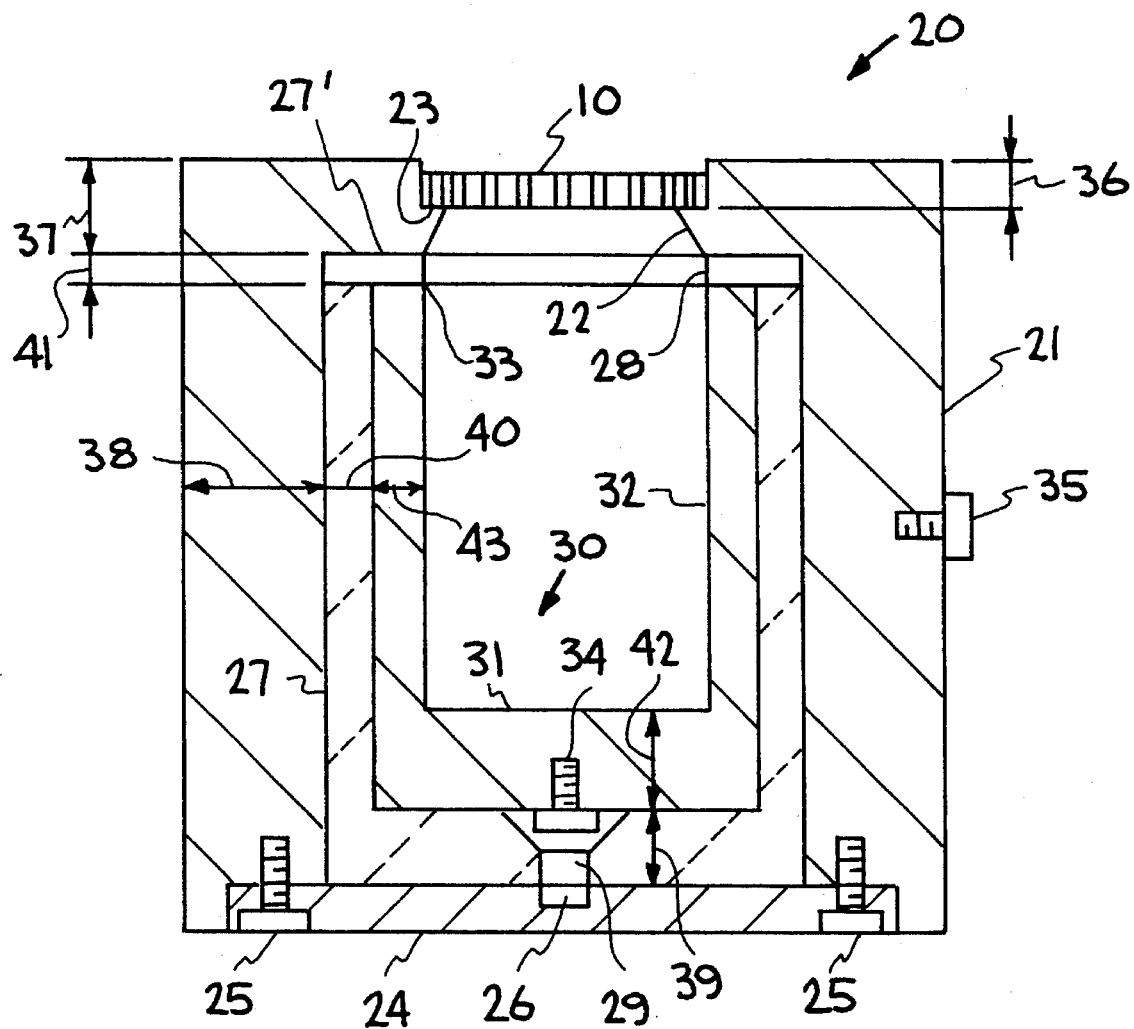
FIG. 3 is a cross-section of a modified Faraday cup with the slit disk of FIG. 1 mounted thereon.
Figure 4:
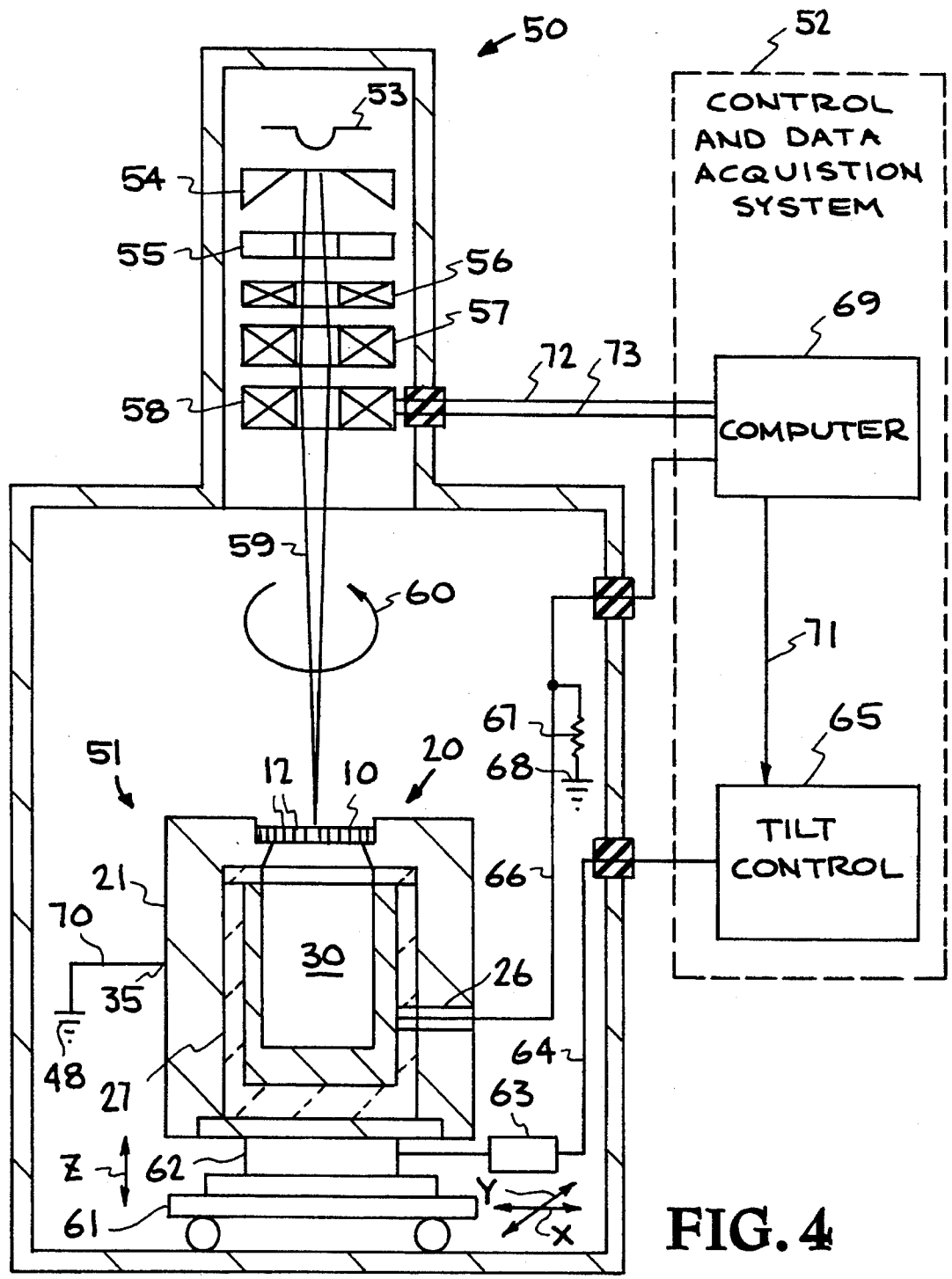
FIG. 4 schematically illustrates an embodiment of the improved system of this invention.

The present invention comprises a refractory metal disk (FIG. 1) with a number (usually odd) of slits equally spaced in a radial pattern above a Faraday cup (FIG. 3) and a controlling computer with outputs for controlling beam direction and an input for data acquisition (FIG. 4). FIG. 2 illustrates a cross-section of one of the slits in the FIG. 1 disk so that the walls of the slit do not adversely effect the passage of the beam therethrough as discussed hereinafter.

An electron beam, as seen in FIG. 4, is swept in a circular pattern at a constant distance from the center of the slit disk so that its path crosses each of the radial slits in the disk at a right angle. Most of the electrons in the beam hit the slit disk which, along with an outer copper shield about a modified Faraday cup, see FIG. 3, is grounded, but as the beam passes over a slit, part of it falls through and is caught by the Faraday cup. This part of the electron beam forms a current that travels to ground through the signal wire and a sensing resistor, See FIG. 4. The current creates a voltage across the resistor that is read by an analog to digital acquisition board in a computer, see FIG. 4. The data acquisition board thus saves a time record which contains profiles of the beam as it travels across each of the slits in the disk. During its circular path the beam crosses each of the slits so the data acquisition device will have a profile of the beam at the number of angles necessary for tomographic reconstruction.

In the system of this invention, the signals used to control the deflection of the beam and the acquisition of the beam profile data are all done directly by input/output boards within the computer. In the system of the above-referenced copending application and patent, the beam deflection signal generation and the data acquisition were done by devices separate from the computer. By placing all of these devices in the computer, the entire process, including the tomographic reconstruction, as described and illustrated in the above-referenced patent, can be done immediately. In the system of the prior patent, the data would have to be transferred to other computers for reconstruction, a process that was time consuming.

Figure 1:
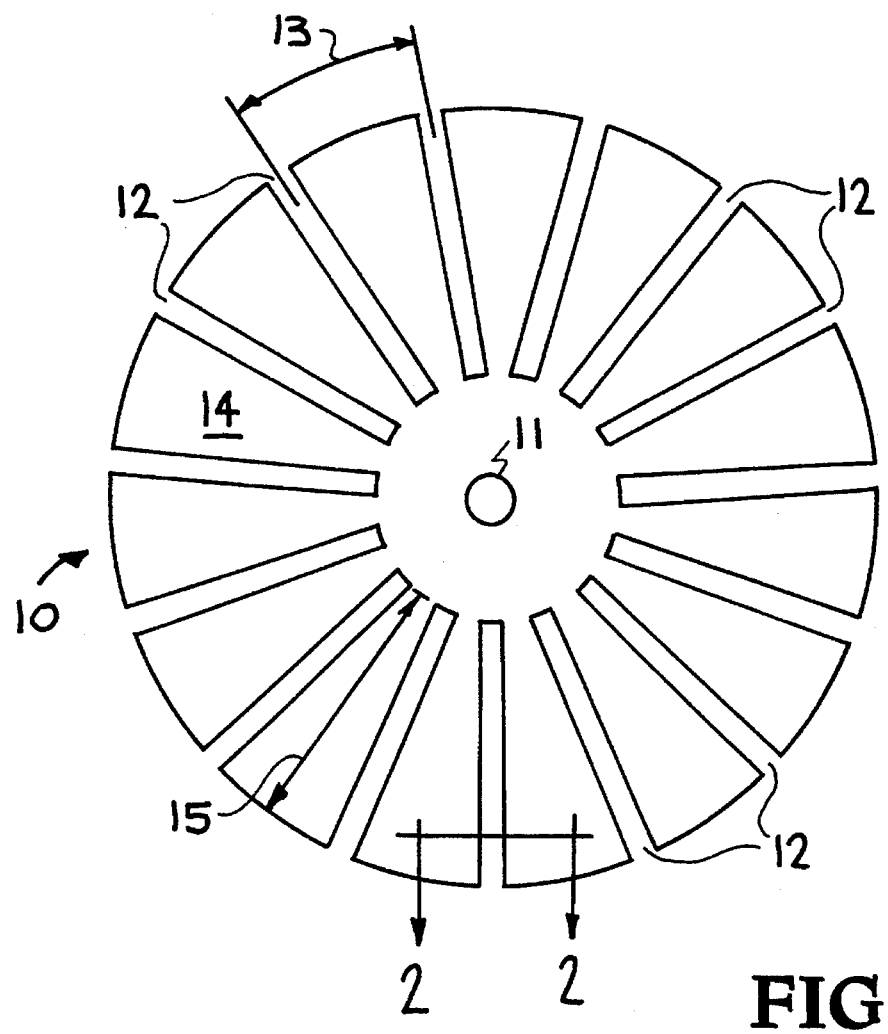
FIG. 1 is an enlarged plan view of a refractory metal disk with radially extending slits as utilized in the present invention.
Figure 2:
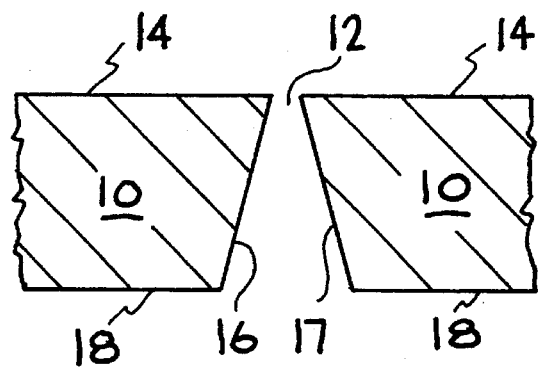
FIG. 2 is an enlarged cross-section taken along the line 2—2 of FIG. 1 illustrating a tapered configuration of the slits of the FIG. 1 disk.

Referring now to FIGS. 1 and 2 which illustrate a refractory metal disk, constructed of tungsten, for example, generally indicated at 10, is provided with a center hole 11 and a number (usually odd) of slits 12 extending radially outward from said center hole 11 but spaced from said center hole. In this embodiment, the disk 10 contains seventeen (17) slits 12. The disk 10 has, for example, a diameter of 1.5 inches and a thickness of 0.125 inch ±0.005 inch, and in addition to tungsten can be constructed of tantalum, tungsten-rhenium, or other refractory materials. The center hole 11 has a diameter of 0.040 inch ±0.002 inch and is ±0.002 inch from true center. The 17 slits 12 in disk 10 are equally spaced at 21.18°±0.02°, as indicated by double arrow 13, have a width of 0.004 inch±0.002 inch on the upper surface 14 of disk 10 and a length of 0.500 inch±0.005 inch, as indicated by double arrow 15, and terminate a distance of about 0.250 inch from the true center hole 11.

FIG. 2 is an enlarged cross section of a section of disk 10 and a single slit 12 looking radially outwardly in the direction of arrows 2—2 of FIG. 1, wherein the slit 12 has tapered surfaces 16 and 17 tapering outwardly and downwardly from upper surface 14 to a lower surface 18 or disk 10. The slit 12, as discussed in greater detail hereinafter, are tapered, beveled, etc. to remove material of the disk 10 behind the slits in surface 14 of the disk to improve sensitivity and prevent beam reflections and/or secondary electrons, while providing adequate heat dissipation generated by the electron beam crossing the slits 12. The tapered surfaces 16 and 17 are exemplified as being at a 10° angle and can be increased or decreased by about 2–4 degrees.

FIG. 3 is a cross-section of an embodiment of a modified Faraday cup (MFC), generally indicated at 20, having an outer shield 21 with a tapered opening 22 having an inwardly projecting surface 23 on which the tungsten slit disk 10 of FIG. 1 is snugly positioned. Outer shield 21, which may be constructed of copper, includes a lower plate section 24, also constructed of copper and secured thereto by bolts or screws 25, with plate section 24 having a groove 26 therein. Positioned within outer shield 21 is a cup, liner or insulator 27, having an annular cap 27', and which may be constructed of a high melting point material such as ceramic material. Annular cap 27' includes an opening 28 in alignment with opening 22 of shield 21, while cup 27 is provided with an opening 29 in alignment with groove 26 of lower plate section 24. A Faraday cup, generally indicated at 30, having a bottom section 31 and wall section 32 is mounted within liner 27. The Faraday cup 30 is open as indicated at 33 and the inner surface of wall section 32 aligns with opening 28 of liner or insulator 27 and opening 22 in outer shield 21. An electrical contact, not shown, is secured via a cap screw 34 in bottom section 31 of Faraday cup 30 and is in alignment with opening 29 in liner 27 and groove 26 in lower plate section 24 of shield 21 and is adapted to be connected to a sensing resistor as described hereinafter with respect to FIG. 4. Outer shield 21 is provided with an electrical contact, not shown, secured by a cap screw 35, and which is adapted to be connected to ground as described hereinafter, with the outer perimeter of slit disk 10 being connected to ground via outer shield 21 and electrical contact via cap screw 35. Cap screws 34 and 35 and bolts or screws 25 may be constructed of stainless steel, steel, or other appropriate material.

By way of example, the outer shield 21 may, in addition to copper, be constructed of any conductive material, having a height of 4.0 inches and width of 4.5 inches, with surface 23 on which disk 10 is positioned having a diameter of 1.5 inches to enable a contact fit with disk 10, and with tapered opening 22 adjacent disk 10 having a diameter of 1.25 inches and a diameter of 1.5 inches adjacent opening 28 of cap 27' of cup or liner 27. The surface 23 is located a distance of 0.150 inch from the outer surface of shield 21 as indicated by arrow 36, with the upper end of shield 21 having a thickness of 0.75 inch as indicated by arrow 37, and with the wall surfaces of shield 21 having a thickness of 1.0 inch as indicated by arrow 38, and with lower plate section 24 having a thickness of 0.375 inch. Ceramic insulator or liner 27 may be composed of any machinable, insulating, vacuum-compatible ceramic, such as MACOR, having a bottom section of a thickness of 0.375 inch as indicated by arrow 39, a side wall thickness of 0.25 inch as indicated by arrow 40, and a top section having a thickness of 0.150 inch as indicated by arrow 41. The Faraday cup 30, may in addition to copper be constructed of any metal with comparable electrical conductivity and melting point, such as silver or stainless steel, with bottom section 31 having a thickness of 0.75 inch as indicated by arrow 42, and the wall section 32 having a thickness of 0.25 inch as indicated by arrow 43. Opening 28 in liner 27 and opening 33 of Faraday cup 30 have a diameter of 1.5 inches, which correspond to the diameter of slit disk 10 and surface 23 of shield 21.

FIG. 4 schematically illustrates an embodiment of the modified Faraday cup illustrated in FIG. 3 and incorporating the slit disk of FIG. 1 in a system for taking electron beam profile data. The system of FIG. 4 involves three (3) interconnected components or sub-systems: an electron beam gun generally indicated at 50, a modified Faraday cup (MFC) assembly generally indicated at 51, and a control and data acquisition system 52. System 52 functions to control elements of the gun 50 and the MFC assembly 51 as well as storing the acquired data. A comparison of the system of FIG. 4 with the system of the above-referenced copending application and patent will clearly illustrate the simplification in the MFC assembly and the control and data acquisition system.

The electron beam gun 50, such as may be used in a welding machine, basically comprises a filament 53, cathode 54, anode 55, alignment coil 56, magnetic lens 57, and defection coil 58. The filament 53 may be of any desired configuration, such as a ribbon type or a hairpin type as known in the art. The various components of gun 50, and detail of filament 53 are known in the art and do not constitute part of this invention. The deflection coil 58 is connected so as to be controlled by system 52 to deflect an electron beam produced by gun 50 and indicated at 59 in a circular pattern as indicated by arrow 60. The beam 59 is moved via deflection coil 18 to sweep across each of the slits 12 in the slit disk 10 in the MFC 20 of the MFC assembly 51 as the beam 59 is deflected in a circular pattern as indicated by arrow 60.

The MFC 20, such as the embodiment illustrated in detail in FIG. 3, is mounted on a movable assembly 61, via a support member 62 and an actuator 63 connected via line 64 to a tilt controller 65 of control and data acquisition system 52. The movable assembly 61, composed of x, y, and z translation stages as indicated by the double arrows x, y, and z, provides the capability of movement of MFC 20 as desired to accurately align the slits 12 of slit disk 10 with the electron beam 59 as it moves in a circular pattern around the disk 10, as discussed in greater detail hereinafter. The electrical contact 34 of MFC 20 (see FIG. 3) is connected via an electrical cable or lead 66, which passes through opening 29 in insulator or liner 27 and groove 26 in bottom plate section 24 of housing 21, to a current viewing or sensing resistor 67 and to a common ground as indicated at 68, and to a computer 69 of system 52. The voltage across the resistor 67 is measured and stored in computer 69 for each slit 12 as beam 59 passes thereacross. Housing 21 of MFC 20 is electrically connected to the common ground 48 via a cable or lead 70 connected to electrical contact 35. By way of example, the resistor 67 may be 100 ohms.

The control and data acquisition system 52 consists of computer 69 and tilt controller 65, with computer 69 being connected to tilt controller 65 via a cable or lead 71 and to deflection coil 58 of electron gun 50 via leads or cables 72 and 73. Thus, unlike the system of the above-referenced copending application and patent, the system of this invention is controlled by a single computer. To accurately position the MFC 20 with respect to the sweep of the electron beam 59 across the slits 12 of disk 10, the computer 69 through tilt controller 65 actuates actuator 63 to move the movable assembly 61 in any desired direction. To initiate acquisition of beam profile data via MFC 20 the electron gun 50 is turned on and the computer 69 activates deflection coil 58 of electron gun 50 to move the beam 59 in a circular pattern so as to cross each slit 12 of disk 10, and receives the output data from MFC 20 via lead 66 and resistor 47. Thus, a single computer is used to generate the signals actuating the electron beam sweep, to acquire the data from the MFC, and to do the reconstruction of the beam profile data to produce a tomographic profile of the power distribution in the electron beam, as described in the above referenced patent, for example.

Because each of the angular profiles is acquired using a different slit 12 in slit disk 10, it is important that the slit disk be accurately centered on and made perpendicular to an undetected beam. In order to facilitate this the small hole 11 has been drilled in the center of the slit disk. The disk may then be centered on the beam 59 by moving the MFC 20 around, via movable assembly 61, until a signal read across the sensing resistor 67, indicates that the center hole 11 is aligned with the beam 59. If the slit disk 10 is tilted and the slits 12 are not perpendicular to the beam, then the beam path through some of the slits 12 will be narrowed or cut off completely since the slit disk has a thickness that is much larger than the width of the slits. Tilt of the MFC 20 is checked by sweeping the beam 59 in its circular pattern, indicated by arrow 60, and adjusting the tilt via tilt controller 65 and assembly 61 until a clear signal comes through each slit.

The problem of sensitivity to tilt may be minimized by removing material behind the top surface forming the slits so that only material at the top surface 14 of the slit disk 10 forms the slits 12 while remembering that it is important to provide as much disk material possible to adequately dissipate heat generated by the electron beam. FIG. 2 illustrates an approach to solving the tilt sensitivity problem by tapering the walls of the slit 12 as indicated at 16 and 17 so that the walls are not perpendicular to the front or top surface 14 of slit disk 10. Instead of the tapered configuration of wall surfaces 16 and 17 in FIG. 2, the wall surfaces could be beveled or otherwise configured such that the bottom of the slits is wider than the width on the slit at the top surface 14 of disk 10.

It has thus been shown that the present invention provides a simplified system for tomographic determination of the power distribution in electron beams, by providing a modified Faraday cup with a refractory slit disk having the slits extending in a radial direction, and utilizing a single computer to generate the signals actuating the beam sweep around the slit disk, to acquire data from the Faraday cup, and to do the tomographic reconstruction of the data. The present invention can be utilized with high-power, high-intensity multiple kilowatt (20 kV plus) electron beams, or with low-power (1 kV) beams, as well as for analysis of ion beams. Thus, the invention is not limited only to electron beam applications, such as used in welding machines, but has a wide application for the analysis of any type of energy producing beams, such as the generation of x-rays or use in electron beam lithography. The system and process of this invention may, for example, be used in examination of beam power density prior to use to ensure the beam has the desired characteristics, or for diagnostic purposes, such as determining changes in an electron beam gun over time.

While a particular embodiment has been described and illustrated on particular material, parameters, etc. have been set forth to exemplify the invention, such are not intended to be limiting. Modifications and changes may become apparent to those skilled in the art, and it is intended the scope of the invention be limited only by the scope of the appended claims.

The invention claimed is:

1. A tomographic process for determining the power distribution in a beam of energy, comprising:

obtaining beam profile data by sweeping a beam of energy across a plurality of slits in a modified Faraday cup at the same angle with respect to each slit; and reconstructing the power distribution in the beam by processing the thus obtained beam profile data via computer tomography.

2. The process of claim 1, additionally including positioning the modified Faraday cup such that the beam of energy is swept across each slit in a substantially perpendicular direction across the slit.

3. The process of claim 2, wherein positioning of the modified Faraday cup is carried out by providing means for moving the modified Faraday cup in x, y, and z directions.

4. The process of claim 1, additionally including providing means for deflecting the beam of energy in a circular pattern such that a sweep of the beam crosses each of the plurality of slits.

5. The process of claim 1, additionally including providing the modified Faraday cup with a disk containing the plurality of slits.

6. The process of claim 5, additionally including forming the slits in the disk so as to be equally spaced and radially extending.

7. The process of claim 6, additionally including forming a center hole in the disk for aligning the modified Faraday cup with the beam of energy prior to sweeping the beam of energy across the plurality of slits.

8. The process of claim 1, additionally including providing means for aligning the modified Faraday cup with the beam of energy and aligning the plurality of slits such that the beam of energy is swept across the slits at a substantially right angle thereto.

9. The process of claim 8, wherein the means for aligning is provided by a movable assembly on which the modified Faraday cup is positioned for tilting the modified Faraday cup, a tilt controller operatively connected to the movable assembly, and a computer operatively connected to the tilt controller.

10. The process of claim 8, additionally including providing a single computer for controlling the means for aligning the modified Faraday cup with the beam of energy, and for initiating a sweep of the beam of energy across the plurality of slits.

11. The process of claim 1, additionally including forming the plurality of slits in a disk, such that the slits extend radially outwardly.

12. The process of claim 11, additionally including forming the plurality of slits such that an upper side thereof in narrower than a lower side thereof.

13. The process of claim 12, additionally including tapering side walls of the slits outwardly from the upper surface to the lower surface.

14. A system for tomographic determination of the power distribution in electron beams, including means for deflecting an associated electron beam in a circular pattern, a modified Faraday cup having a disk with radially extending slits therein, and means for collecting data from the modified Faraday cup as an associated electron beam crosses each of the slits in the disks for reconstructing the power distribution profile of an associated electron beam.

15. The system of claim 14, additionally including means for forming the electron beam.

16. The system of claim 14, additionally including means for aligning said modified Faraday cup with an associated electron beam.

17. The system of claim 16, wherein said means for deflecting an associated electron beam and said means for aligning the modified Faraday cup with an associated electron beam includes a single computer.

18. The system of claim 17, wherein said means for deflecting an associated electron beam includes at least one deflecting coil operatively connected to said single computer.

19. The system of claim 18, wherein said means for aligning the modified Faraday cup with an associated electron beam includes a movable assembly upon which said modified Faraday cup is located, and a tilt controller operatively connected to said movable assembly and to said single computer.

20. The system of claim 14, wherein said disk additionally includes a central opening therein, and wherein said radially extending slot extend outward from said central opening without being in contact therewith.

\* \* \* \* \*